United States Patent [19]

Betts et al.

[11] Patent Number: 4,534,036

[45] Date of Patent: Aug. 6, 1985

[54] PHASE TRACKING LOOP IMPAIRMENT MONITOR FOR MODEMS

[75] Inventors: William L. Betts, Maderia Beach; Kenneth Martinez, Pinellas Park, both of Fla.

[73] Assignee: Paradyne Corporation, Fla.

[21] Appl. No.: 447,989

[22] Filed: Dec. 8, 1982

[51] Int. Cl.³ .............................................. H03L 7/08
[52] U.S. Cl. ..................................... 375/10; 327/111; 375/120; 331/17
[58] Field of Search ........................ 329/111, 122, 124; 307/511; 328/155; 375/10, 118, 119, 120; 331/1 R, 1 A, 17

[56] References Cited

U.S. PATENT DOCUMENTS

| | | | |
|---|---|---|---|
| 4,424,497 | 1/1984 | Fellinger | 375/120 |
| 4,442,412 | 4/1984 | Smith et al. | 331/17 |
| 4,456,890 | 6/1984 | Carickhoff | 331/17 |
| 4,465,982 | 8/1984 | Jernakoff | 331/17 |

Primary Examiner—Benedict V. Safourek
Attorney, Agent, or Firm—Kane, Dalsimer, Kane, Sullivan & Kurucz

[57] ABSTRACT

This invention provides a system which monitors the phase error signal generated by a phase tracking loop. The system includes a first circuit for averaging the phase error signal thus generating an uncorrected phase error, and a second signal for integrating the phase error to generate a corrected phase signal. The two generated signals are added together to yield a total phase error signal.

4 Claims, 2 Drawing Figures

PHASE TRACKING LOOP IMPAIRMENT MONITOR FOR MODEMS

BACKGROUND OF THE INVENTION

The present invention relates to modems using QAM modulation techniques and in particular to a circuit for monitoring phase jitter.

Phase jitter and frequency offset are two line impairments which have a detrimental effect on the incoming signal in a digital modem receiver. To prevent these impairments from causing errors in the demodulated modem signal a phase tracking loop may be utilized, as disclosed in the commonly assigned co-pending application Ser. No. 407,451 filed on 8/12/82 which is incorporated herein by reference. Actually, the phase tracking loop is effective with respect to frequency offset and low frequency, low amplitude phase jitter while high amplitude phase jitter sometimes cannot be tracked out by the phase tracking loop.

In the past separate systems had to be provided for modems for measuring the phase impairment of the line. The present invention makes use of the phase lock loop error signal to derive and monitor the phase error of a line In view of the above, it is the principal objective of the present invention to provide an improved circuit for a digital modem wherein the phase error function is derived from the phase lock loop circuit.

A further objective is to provide such a circuit which may be implemented in a conventional digital modem.

Still further objects and advantages will be apparent from the following description of the invention.

SUMMARY OF THE INVENTION

The phase tracking loop described in the previously specified application comprises a phase error signal generating portion, a frequency offset integrator, and a phase corrector. The phase error is fed to the frequency offset integrator which generates a signal which is proportional to the phase error due to the frequency offset. The output of the frequency offset integrator is added to the original phase error to provide an input to the phase corrector.

The present invention comprises a corrected phase error signal circuit (CPE) and an uncorrected phase error signal circuit (UPE). The UPE circuit merely averages the phase error signal. This average value represents the uncorrected high frequency phase error. The CPE circuit duplicates the function of the phase tracking circuit but without the frequency offset integrator. The output of the CPE represents the corrected phase jitter error. The output of the two circuits are added to form a total phase error signal.

DETAILED DESCRIPTION OF THE PREFERRED EMBODIMENT

Figure 1:
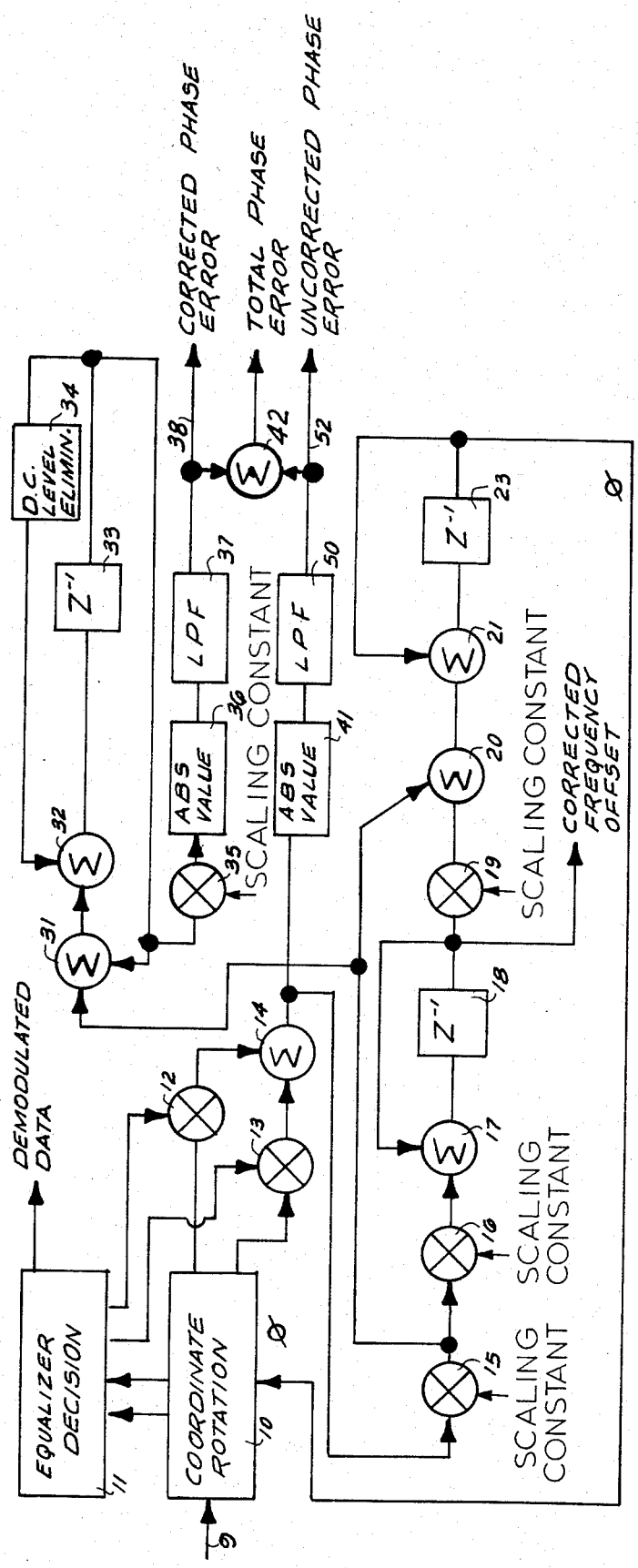
FIG. 1 is a block diagram of the phase tracking loop and the monitoring circuitry of the present invention; and, FIG. 2 shows the elements of a standard low pass filter.

In order to insure a clear understanding of the invention a brief description of the tracking loop is first presented. As previously stated, the tracking loop comprises a phase-error generating portion; a frequency offset integrator and a phase corrector.

The phase error generating portion consists of coordinate rotation circuit 10, equalizer decision circuit 11, multipliers 12, and 13, and adder 14. The coordinate rotation circuit 10, rotates the coordinates of the signals received by the modem on line 9 by the phase angle $\phi$ determined by the phase corrector. The rotated coordinates are transmitted in rectangular form to equalizer decision circuit 11 which makes a decision as to which signal was probably sent based on the received rotated coordinates and generates demodulated data. The equalizer decision circuit also generates a complex phase reference number. The rotated coordinates are cross-multiplied with the components of a complex number to obtain the imaginary component which is proportional to the phase error. This complex arithmetic operation is performed by multipliers 12 and 13 and adder 14.

The output of adder 14 is the phase error and it is scaling multiplier 15 and then fed into scaling multiplier 15 and then the frequency offset generator comprising multiplier 16, adder 17 and integrator 18. The multiplier just multiplies the phase error by a constant. The output of the frequency offset generator is multiplied by multiplier 19 and it represents the phase error caused by frequency offset. Both the phase error and the frequency offset output are then fed into adder 20 which then feeds the sum the outputs of sealing multipliers 15 and 19 to the phase corrector formed by adder 21 and integrator 23. The output of the phase integrator is an angle $\phi$ which is fed back into coordinate rotation circuit 10 and is used to rotate the coordinates of the signal received on line 9 to correct its phase error.

Initially while the frequency offset generator is set to zero, the phase corrector is set at any arbitrary value. As the phase correction goes in, this arbitrary value is rapidly eliminated by the phase lock loop.

As previously indicated the present invention comprises a section for generating a corrected phase error and a section for generating an uncorrected phase error. The uncorrected phase error section comprises an absolute value circuit 41 and low pass filter circuit 50. Together circuits 41 and 50 average and smooth out the phase error generated by adder 14 and the output 52 of 50 is proportional to the uncorrected phase error, i.e. the phase error due to the high frequency phase jitter which could not be tracked out by the loop.

The corrected phase error section comprises adders 31 and 32, integrator 33, multiplier 35, absolute value circuit 36, and low pass filter 37. The adder 31 and integrator 33 in effect duplicate the function of the phase corrector, the only difference being that the effects of the frequency offset are being ignored. The resulting output 33a is proportional to the corrected phase error due to low frequency jitter. This output is multiplied by a scaling constant by multiplier 35 and averaged by absolute value circuit 36 and low pass filter 37, to yield a final output 38 which is the corrected phase error. The two outputs 38 and 52 are added by adder 42 to generate a total phase error.

As previously indicated, initially integrator 23 of the phase tracking loop outputs an arbitrary phase angle. This arbitrary phase angle has the effect of causing a D.C. level in the output of integrator 33, of the corrected phase error circuit. D.C. level eliminator 34 is provided to eliminate this effect by adding a number to the output of adder 31, i.e. adder 32. The output of adder 32 becomes the input of integrator 33. More specifically, the D.C. eliminator feeda a "+1" to adder 32 if the output 33*a* of integrator 33 is negative, and "−1" if 33*a* is positive.

Figure 2:
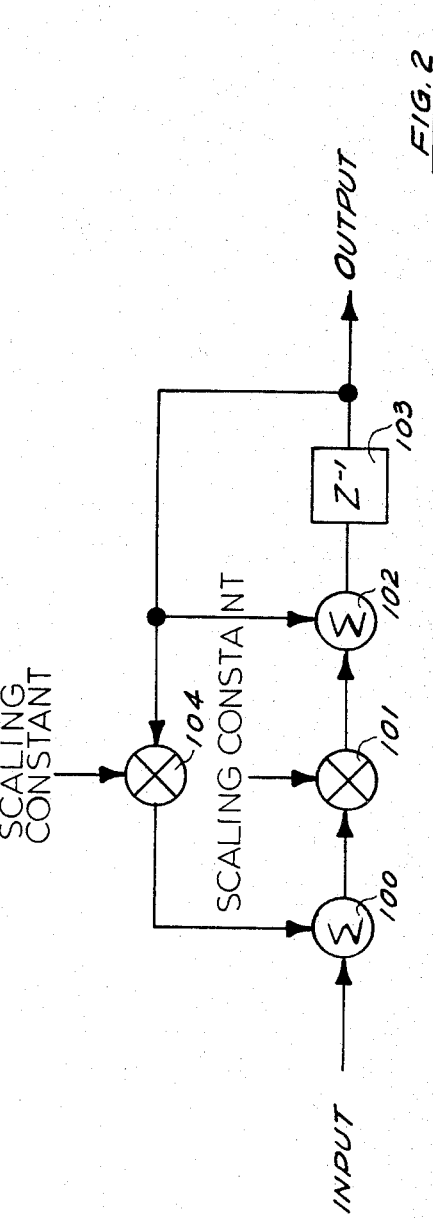

Low pass filters such as 37 and 50 are well known in the art, and as shown in FIG. 2. They may comprise a first and second adder 100 and 102, and an integrator. The filter's input is fed to adder 100. The output of 100 is scaled by a multiplier 101 before it is fed into adder 102. The output of 102 is fed into integrator 103, and the output of the integrator is fed back into adder 102, and after scaling by multiplier 104, to adder 100.

I claim:

1. In a modem utilizing a phase tracking loop provided to correct phase error by generating an instantaneous phase error signal, a monitor system comprising:

a first circuit for deriving a corrected phase error signal comprising an integrator which integrates said instantaneous error signal, a first absolute value generator means and a low pass filter means; and a second circuit for deriving an uncorrected phase error signal by averaging said instantaneous phase error signal.

2. The monitor system of claim 1 wherein said second circuit comprises a second absolute value generator means and another low pass filter provided to average said output of said tracking loop.

3. The monitor system of claim 1, further comprising an adding means which adds said corrected phase error signal and said uncorrected phase error signal to generate a total phase error signal.

4. The monitor system of claim 1 wherein said first circuit further comprises means for eliminating the D.C. level of said output of said integrator.

* * * * *